(12) United States Patent
Coady et al.

(10) Patent No.: US 8,574,815 B2
(45) Date of Patent: Nov. 5, 2013

(54) PATTERNING NANO-SCALE PATTERNS ON A FILM COMPRISING UNZIPPING COPOLYMERS

(75) Inventors: Daniel J. Coady, San Jose, CA (US); Urs T. Duerig, Rueschlikon (CH); Jane E. Frommer, San Jose, CA (US); Kazuki Fukushima, San Jose, CA (US); James L. Hedrick, San Jose, CA (US); Armin W. Knoll, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/570,921

(22) Filed: Aug. 9, 2012

(65) Prior Publication Data
US 2012/0301672 A1 Nov. 29, 2012

Related U.S. Application Data
(62) Division of application No. 12/894,412, filed on Sep. 30, 2010.

(51) Int. Cl.
*G03F 7/00* (2006.01)
*G03F 7/004* (2006.01)

(52) U.S. Cl.
USPC .................................................. 430/270.1

(58) Field of Classification Search
USPC .............. 430/270.1, 322, 330, 331, 905, 913, 430/273.1
See application file for complete search history.

(56) References Cited

U.S. PATENT DOCUMENTS

| | | | |
|---|---|---|---|
| 3,984,253 | A | 10/1976 | Nelson |
| 5,147,741 | A | 9/1992 | Araps et al. |
| 5,225,314 | A | 7/1993 | Waterman et al. |
| 5,314,709 | A | 5/1994 | Doany et al. |
| 6,926,953 | B2 | 8/2005 | Nealey et al. |
| 7,521,090 | B1 | 4/2009 | Cheng et al. |
| 8,012,400 | B2 | 9/2011 | Mirkin et al. |
| 8,168,284 | B2 | 5/2012 | Nealey et al. |
| 2004/0241573 | A1 | 12/2004 | Ray et al. |
| 2007/0114401 | A1 | 5/2007 | King et al. |
| 2010/0107742 | A1 | 5/2010 | Liu et al. |
| 2010/0160120 | A1 | 6/2010 | Duchovne |
| 2010/0316960 | A1 | 12/2010 | Duerig et al. |
| 2012/0082944 | A1* | 4/2012 | Coady et al. .................. 430/326 |

OTHER PUBLICATIONS

Hua et al., "Nanoscale Thermal Lithography by Local Polymer Decomposition Using a Heated Atomic force Microscope Cantilever Tip," J. of Micro/Nanolithography, MAMS and MOEMS, vol. 6, Issue 2 (2007).

(Continued)

*Primary Examiner* — Amanda C. Walke
(74) *Attorney, Agent, or Firm* — Cantor Colburn LLP; Daniel Morris (57) ABSTRACT

The invention concerns a method for patterning a surface of a material. A substrate having a polymer film thereon is provided. The polymer is a selectively reactive polymer (e.g., thermodynamically unstable): it is able to unzip upon suitable stimulation. A probe is used to create patterns on the film. During the patterning, the film is locally stimulated for unzipping polymer chains. Hence, a basic idea is to provide a stimulus to the polymeric material, which in turn spontaneously decomposes e.g., into volatile constituents. For example, the film is thermally stimulated in order to break a single bond in a polymer chain, which is sufficient to trigger the decomposition of the entire polymer chain.

10 Claims, 5 Drawing Sheets

(56) References Cited

OTHER PUBLICATIONS

Knoll et al., "Prob-based 3-D Nanolithography Using self-Amplified Depolymerization Polymers," Adv. Materials, 22, 3361-3365 (2010).
Nyffenegger et al., "Nanometer-Scale Surface Modification Using the Scanning Probe Microscope: Progress since 1991", Chemical Reviews, 1997, vol. 97, p. 1195-1230.
Ricardo Garcia et al., "Nano-Chemistry and Scanning Probe Nanolithographies," Chem. Soc. Rev., Royal Society of Chemistry, 2006, vol. 35, pp. 29-38.
Philippe Degee et al., "New Catalysis for Fast Bulk Ring-Opening Polymerization of Lactide Monomers," Macromol. symp., 1999, 144, pp. 289-302.
Hiroshi Ito et al., "Thermally Developable, Positive Resist Systems with High Sensitivity," J. Electrochem. Soc., vol. 136, No. 1, pp. 241-245, Jan. 1989.
Nahrain E. Kamber et al., "Organocatalytic Ring-Opening Polymerization," Chem. Rev. vol. 107, pp. 5813-5840, 2007.
Petr Zuman, "Reactions of Orthophthalaldehyde with Nucleophiles," Chemical Reviews, vol. 104, No. 7, pp. 3217-3238, 2004.
C. Jacobs et al., "Macromolecular Engineering of Polylactones and Polylactides. 5. Synthesis and Characterization of Diblock Copolymers Based on Poly-e-Caprolactone and Poly (L,L or D,L)lactide by Aluminum Alkoxides," Macromolecules, vol. 24, No. 11, May 1991.
Lei Zhang, "Phosphazene Bases: A New Category of Organocatalysts of the Living Ring-Opening Polymerization of Cyclic Esters," Macromolecules, vol. 40, pp. 4154-4158, 2007.
Hajime Yasuda et al., "Stereospecific Polymerization of o-Phthalaldehyde," Macromolecules, vol. 6, No. 2, pp. 303, 304, 1972.
Chuji Aso et al., "Polymerization of Aromatic Aldehydes. III. The Cyclopolymerization of Phthalaldehyde and the Structure of the Polymer," Macromolecules, vol. 2, No. 4, pp. 414-419, 1969.
Chuji Aso et al., "Polymerization of Malealdehyde," J. Polym. Science. B, Polymer Letters, vol. 4, pp. 171-174, 1966.
Hiroshi Ito et al., "Chemical Amplification in the Design of Dry Developing Resist Materials," Technical Papers of SPE Regional Technical Conference on Photopolymers, 1982, 331-353.
Hiroshi Ito et al., "Thermally Developable, Positive Tone, Oxygen Rie Barrier Resist for Bilayer Lithography," J. Electrochem. Soc., vol. 136, No. 1, pp. 245-249, Jan. 1989.
D.J. Worsfold et al., "Cationic Polymerization of Ethylene Oxide. II. Boron Trifluoride," J. Am. Chem. Soc., vol. 79, pp. 900-902, Feb. 1957.
Lei Zhang et al., "Organocatalytic Stereoselective Ring-Opening Polymerization of Lactide with Dimeric Phosphazene Bases," J. Am. Chem. Soc., vol. 129, pp. 12610-12611, 2007.
J. Peter Guthrie, "Hydration of Carbonyl Compounds, an Analysis in Terms of Multidimensional Marcus Theory," J. Am. Chem. Soc., vol. 122, pp. 5529-5538, 2000.
Shiro Kobayashi et al., "Superacids and Their Derivatives. X. Mechanistic Studies of Selective Cyclodimerization of Ethylene Oxide by Superacid Ester Catalysts," Polymer Journal, vol. 11, No. 5, pp. 405-412, 1979.
Hiroshi Ito et al., "Chemical Amplification in the Design of Dry Developing Resist Materials," Polymer Engineering and Science, vol. 23, No. 18, Dec. 1983, pp. 1012-1018.
Chuji Aso et al., "Studies on the Polymerization of Bifunctional Monomers: VI. Cyclopolymerization of Succinaldehyde," Makromol. Chem., 84, 1965, pp. 126-136.
Minoru Tsuda et al., "Acid-Catalyzed Degradation Mechanism of Poly (phthalaldehyde): Unzipping Reaction of Chemical Amplification Resist," Journal of Polymer Science, Part A: Polymer Chemistry, vol. 35, pp. 77-89, 1997.
Darcy A. Culkin et al., "Zwitterionic Polymerization of Lactide to Cyclic Poly(Lactide) by Using N-Heterocyclic Carbene Organocatalysts," Angew. Chem. Int, vol. 46, pp. 2627-2630, 2007.
A. Richard Donovan et al., "A Novel Method for Determination of Polyester End-Groups by NMR Spectroscopy," Polymer 46, pp. 5005-5011, 2005.
Chuji Aso et al., "Polymerization of Aromatic Aldehydes. II. Cationic Cyclopolymerization of Phthalaldehyde," Journal of Polymer Science: Part A-1, vol. 7, pp. 497-511, 1969.
Seo et al., "Patterned Plastics That Change Physical Structure in Response to Applied Chemical Signals," J. American Chemical Society, 132, 9234-9235 (2010).
Tsuda et al., "Acid-Catalyzed Degradation Mechanism of Poly(ohthalaldehyde): Unzipping Reaction of Chemical Amplification Resist," J. of Polymer Science: Part A: Polymer Chemistry, 35, 77-89 (1997).

* cited by examiner

PATTERNING NANO-SCALE PATTERNS ON A FILM COMPRISING UNZIPPING COPOLYMERS

CROSS-REFERENCE TO RELATED APPLICATION

This application is a divisional of U.S. patent application Ser. No. 12/894,412, filed Sep. 30, 2010, the disclosure of which is incorporated by reference herein in its entirety.

FIELD OF THE INVENTION

The invention relates to the field of probe-based methods for patterning a surface of a material, such as scanning probe lithography (herein after SPL). In particular, it may be directed to high resolution patterning on a surface of a material, such as nano-scale patterns with feature sizes of e.g., less than 32 nanometers (nm).

BACKGROUND OF THE INVENTION

Lithography is a process for producing patterns of two dimensional shapes, consisting of drawing primitives such as lines and pixels within a layer of material, such as, for example, a resist coated on a semiconductor device. Conventional photolithography (also called optical lithography) is running into problems as the feature size is reduced, e.g., below 45 nm. These problems arise from fundamental issues such as sources for the low wavelength of light, photoresist collapse, lens system quality for low wavelength light and masks cost. To overcome these issues, alternative approaches are required.

Examples of such alternative approaches are known in the field of the so-called nanolithography, which can be seen as high resolution patterning of surfaces. Nano lithography refers to fabrication techniques of nanometer-scale structures, comprising patterns having one dimension typically sizing up to about 100 nm (hence partly overlapping with photolithography). Beyond the conventional photolithography, they further include such techniques as charged-particle lithography (ion- or electron-beams), nanoimprint lithography and its variants, and SPL (for patterning at the nanometer-scale). SPL is for instance described in detail in Chemical Reviews, 1997, Volume 97 pages 1195 to 1230, "Nanometer-scale Surface Modification Using the Scanning Probe microscope: Progress since 1991", Nyffenegger et al. and the references cited therein, see also Garcia, R.; Martinez, R. V. & Martinez, J., Nano-chemistry and scanning probe nanolithographies, Chem. Soc. Rev., Royal Society of Chemistry, 2006, 35, 29-38.

In general, SPL is used to describe lithographic methods wherein a probe tip is moved across a surface to form a pattern. Scanning probe lithography makes use of scanning probe microscopy (SPM) techniques. SPM techniques rely on scanning a probe, e.g., a sharp tip, in close proximity with a sample surface whilst controlling interactions between the probe and the surface. A confirming image of the sample surface can afterwards be obtained, typically using the same scanning probe in a raster scan of the sample. In the raster scan the probe-surface interaction is recorded as a function of position and images are produced as a two-dimensional grid of data points.

The lateral resolution achieved with SPM varies with the underlying technique: atomic resolution can be achieved in some cases. Use can be made of piezoelectric actuators to execute scanning motions with a precision and accuracy, at any desired length scale up to better than the atomic scale. The two main types of SPM are the scanning tunneling microscopy (STM) and the atomic force microscopy (AFM). In the following, acronyms STM/AFM may refer to either the microscopy technique or to the microscope itself.

In particular, the AFM is a device in which the topography of a sample is modified or sensed by a probe mounted on the end of a cantilever. As the sample is scanned, interactions between the probe and the sample surface cause pivotal deflection of the cantilever. The topography of the sample may thus be determined by detecting this deflection of the probe. Yet, by controlling the deflection of the cantilever or the physical properties of the probe, the surface topography may be modified to produce a pattern on the sample.

Following this idea, in a SPL device, a probe is raster scanned across a functional surface and brought to locally interact with the functional material. By this interaction, material on the surface is removed or changed. In this respect, one may distinguish amongst:

constructive probe lithography, where patterning is carried out by transferring chemical species to the surface; and destructive probe lithography, which consists of physically and/or chemically deforming a substrate's surface by providing energy (mechanical, thermal, photonic, ionic, electronic, X-ray, etc.).

SPL is accordingly a suitable technique for nanolithography.

High resolution patterning of surfaces is relevant to several areas of technology, such as alternatives to optical lithography, patterning for rapid prototyping, direct functionalization of surfaces, mask production for optical and imprint lithography, and data storage.

In particular, lithography can be used for the fabrication of microelectronic devices. In this case, next to conventional lithography, electron-beam (or e-beam) and probe-based lithography are mostly in use.

For high resolution optical mask and nano-imprint master fabrication, e-beam lithography is nowadays a standard technology. However, when approaching high resolutions, writing times for e-beam mask/master fabrication increase unfavorably.

As a possible alternative, the use of probes for such patterning is still under development. At high resolution (<32 nm), the speed of single e-beam and single probe structuring converges.

In the case of data storage, various approaches have been proposed to make use of probes for storage in the archival regime. However, a main challenge that remains is to achieve long bit-retention. Using thermomechanical indentation allows for instance to achieve satisfactory endurance and retention of data. A thermomechanical approach, however, produces indentations that are inherently under mechanical stress. Therefore it is difficult to obtain retention times in excess of ten years, as usually needed in the archival domain.

BRIEF SUMMARY OF THE INVENTION

In one embodiment, the present invention provides a method for patterning a material, comprising: providing a material having a polymer film, the polymer film comprising polymer chains of copolymers derived from two or more monomers, one of the monomers being a dialdehyde compound, whereby the polymer chains are able to unzip upon stimulation; and patterning the film with a nano-scale dimensioned probe, by stimulating the film for triggering an unzipping reaction of polymer chains of the film.

In other embodiments, the method may comprise one or more of the following features:

- the polymer film provided comprises polymer chains for which an energetic or chemical modification event triggers the unzipping reaction and wherein patterning includes stimulating the film such that an energetic or chemical modification event occurs in at least one polymer chain;
- the polymer film provided comprises polymer chains which are able to unzip upon breaking one chemical bond thereof and wherein patterning includes stimulating the film to break one bond of at least one polymer chain;
- patterning includes having the probe provide an energy to the film to activate a chemical reaction involving a reactant in proximity with polymer chains, the chemical reaction allowing in turn for unzipping at least one polymer chain;
- the reactant is an acid-generator;
- the polymer film is provided with the acid-generator comprised therein, the acid-generator being activated during patterning;
- the acid-generator is dispensed by the probe during patterning;
- the acid-generator is a thermal-acid-generator, the thermal-acid-generator activated by the probe, heated during patterning;
- the acid-generator is a photo-acid-generator, the photo-acid-generator activated by light during patterning;
- said one of the monomers is a phthalaldehyde compound;
- polymer chains of the polymer film provided comprises copolymers of phthalaldehyde compounds and benzaldehyde compounds;
- at least some of the benzaldehyde compounds in the polymer chains of the polymer film provided are functionalized benzaldehyde compounds;
- the polymer chains of the polymer film provided globally derive from at least two compounds, one of the compounds being the dialdehyde compound, and at least some of the polymer chains of the polymer film provided comprise block copolymers of two or more homopolymer units, one of the homopolymer units deriving from the dialdehyde compound, whereby said at least some of the polymer chains are able to unzip upon stimulation;
- said at least some of the polymer chains of the polymer film provided are ordered by way of another one of the homopolymer units, substantially more stable than said one of the homopolymer units upon stimulation;
- the polymer chains in the polymer film provided have an average orientation with a non-zero component perpendicular to a plane of the polymer film;
- the polymer chains in the polymer film provided are further ordered such that said at least some of the polymer chains that comprise block copolymers form a structured pattern in the plane of the polymer film;
- the polymer chains in the polymer film provided are further ordered such that said at least some of the polymer chains that comprise block copolymers form a two-dimensional lattice in the plane of the polymer film; and
- said one of the homopolymer units derives from a phthalaldehyde compound, whereas another one of the homopolymer units derives from a compound comprising a functional group capable of initiating a ring-closing polymerization of phthalaldehyde.

The invention can further be embodied, in another aspect, as a material comprising a polymer film, the film comprising: polymer chains which can be unzipped upon stimulation; and nano-scale dimensioned patterns in the film, the patterns obtained according to the invention.

According to yet another aspect, the present invention is embodied as a method of reading nano-scale dimensioned patterns in a polymer film of a material, comprising: providing a material according to the invention; and reading the patterns.

Methods and materials embodying the present invention will now be described, by way of non-limiting examples, and in reference to the accompanying drawings.

DETAILED DESCRIPTION OF THE INVENTION

As an introduction to the following description, general aspects of the invention focus on a method for patterning a surface of a material. A material having a polymer film thereon is provided. The polymer comprises chains which are able to unzip upon suitable stimulation (energetic or chemical modification event, protonation, etc.). Typically, the polymer is chosen such that stimulating a first chemical modification or degradation event triggers an unzipping effect, partial or total. To that aim, polymer chains of copolymers are derived from two or more monomers, one of the monomers being a dialdehyde compound, e.g., phthalaldehyde, which enables an unzip reaction upon suitable stimulation. A probe is then used to create patterns on the film. During the patterning, the film is locally stimulated for triggering an unzipping reaction of polymer chains. As the unzipping effect is self-sustained, depolymerization is facilitated. Patterning a surface is accordingly made easier compared to prior art methods. Deep patterns can even be written with virtually no indentation force being applied to the probe tip. This minimizes pattern distortion resulting from indenting or displacing the material. An advantage is that no fine-tuning of intermolecular forces is required, at variance with materials requiring stabilization from secondary structure such as hydrogen bonds. For example, some of the polymer films as contemplated herein are not susceptible to water and solvent uptake, which may result in deteriorating the patterning properties. A variety of methods can furthermore be implemented for the activation of the intentional decomposition of such materials. For example, they can be thermally activated directly by the probe (energetic modification event). Alternatively, a chemical stimulus, e.g., a free proton from an acid generator included in the polymeric network, may serve this purpose. Finally, the copolymer chains involve at least another compound, distinct from the polyaldehyde, which is used to confer specific properties to the film. For example, this other compound is chosen such as to allow for easier functionalization than the polyaldehyde. In a variant, the polymer chains are synthesized into block-copolymers, one of the block (polyaldehyde) enabling the unzip reaction, whereas the other one is used to order the block copolymer chains.

More details shall be given now, in reference to the figures.

Figure 1:
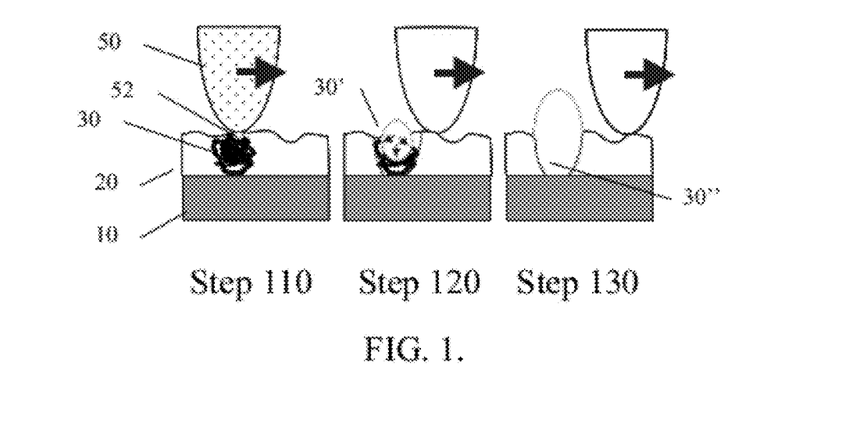
FIGS. 1-5 illustrate steps according to various embodiments of the method of the invention.

FIG. 1 illustrates steps of the method according to a first embodiment of the invention. In reference to FIG. 1, a material 10, 20 is provided, having a polymer film 20 on a substrate 10, where the film comprises the polymer chains 30. In FIG. 1, only one such chain 30 is depicted, for clarity. More will be said later about suitable polymers and how to obtain them.

The probe 50 is typically a SPM (e.g., AFM) probe mounted on the end of a cantilever. The probe may thus be part of an AFM device (not shown), comprising electronic circuitry suitably designed to measure and control, in operation, an interaction between the probe 50 and a sample surface 20.

Engineering solutions, which are known per se, may further be provided such that it is possible to accurately control the relative position of the probe and surface, and possibly to ensure good vibrational isolation of the SPM. This can for instance be achieved using sensitive piezoelectric positioning devices, as known in the art. Both vertical and horizontal controls of the probe are thus typically provided together with the SPM.

In a usual SPM device, the probe 50 is raster scanned above the sample surface, such that imaging of the surface topology can be carried out. Here, the probe is rather used primarily to engrave patterns on the surface of the film 20.

How the surface is patterned can be decomposed into several substeps.

Before patterning occurs properly, the probe 50 is maintained in a "non-patterning position", that is, close to the surface of the film 20 (not depicted). The probe is not yet in close enough contact to enable surface patterning.

In the embodiment of FIG. 1, a first substep 110 consists of stimulating the film 20 e.g., directly with the probe. Here an energy sufficient for the polymer to unzip is provided to the film, via an energetic modification event, for example by raising the temperature of the tip in order to provide thermal energy to the polymer resist. In particular, the polymer can be chosen such that the energy provided suffices to break one bond of one or more polymer chains 30, as depicted in FIG. 1, step 110. In practice, the probe is put in close proximity to or in direct contact with the surface of the film 20 while being suitably heated. The force and the time of the exposure are tuned according to the polymer used in the film and the desired patterns.

At least some of the polymer chains are able to unzip upon suitable stimulation, e.g., via an energetic or a chemical modification event. Such an event may for instance result in breaking a single chemical bond of the chain, which in turn triggers the unzipping reaction. This contrasts with polymers (e.g., polystyrene, poly-α-styrene) which would unzip if the polymer chain has enough thermal energy to decompose. Here, one broken bond suffices to trigger the unzipping effect. As noted earlier, the latter is self-sustained, such that less energy needs to be provided for the polymer to unzip during the patterning process.

The above principles are illustrated in steps 120 and 130 of FIG. 1. At step 120, degradation of a given polymer chain 30' begins. At step 130, the polymer chain 30" is entirely degraded, e.g., into volatiles such as monomers. In other words, the polymer chain that was previously stimulated (step 110) has now disappeared. A clean patterned surface is accordingly obtained.

Figure 7:
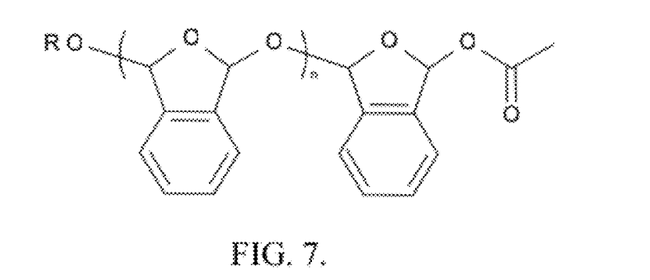
FIG. 7 depicts the chemical structure of a poly(phthalaldehyde), that can be used as one of the block of a copolymer, in embodiments.

Briefly, a polymer chain part suitable to implement the above principle is a poly(phthalaldehyde), whose chemical structure is depicted in FIG. 7. The present embodiment (i.e., FIG. 1) was notably implemented with polymer chains comprising blocks of poly(phthalaldehyde) having a molecular weight of approximately 27 kDa, corresponding to ~200 monomer units per block (e.g., a typical monomer weight is 134). As the obtained polymer is thermodynamically unstable at room temperature, the energetic cost of the patterning process is very much affordable. More shall be said in reference to FIGS. 7-11 below.

Figure 2:
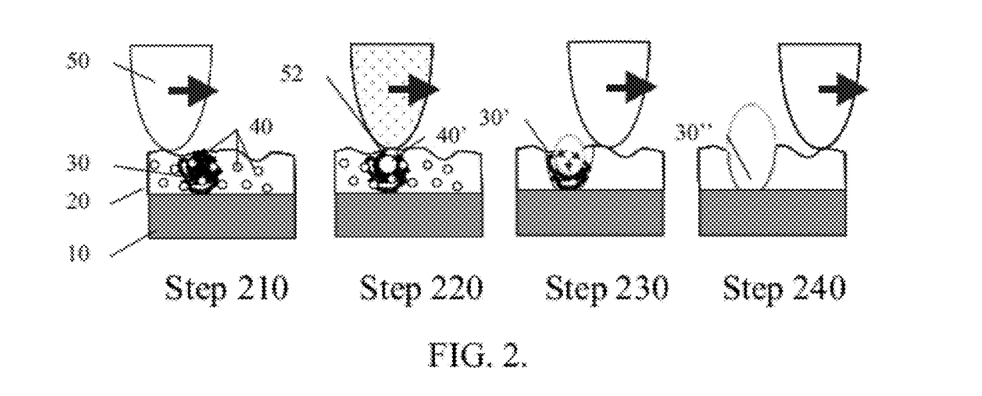

FIG. 2 is directed to another embodiment of the method according to the invention. This embodiment is similar to FIG. 1, except that the probe now stimulates the film (step 220) with an energy adapted to activate a chemical reaction 40'. Briefly, the chemical reaction involves a reactant 40, 40' in proximity with the polymer chains 30, whereby a chemical modification of one polymer chain likely occurs. This shall in turn allow for unzipping polymer chains 30, 30', 30". The chain of causation is then interpreted as follows: a chemical reaction occurs; the chemical reaction triggers a chemical modification event (e.g., a degradation event) in a polymer chain; and the said event triggers the unzipping reaction. Hence, advantage is taken from the reaction to provide the energy necessary for triggering and possibly maintaining the unzip effect. However, the principle remains the same as in the embodiment of FIG. 1: the film is stimulated such that an unzipping reaction is triggered. Accordingly, less energy is needed to pattern the film.

For example, the reactant can be an acid-generator. Preferably, the polymer film 20 is provided with the acid-generator 40 comprised therein (e.g., immersed). Thus, the acid generator can be activated directly by the probe 50 or by a light pulse at the level of the probe when patterning. Here, the depolymerization reaction is induced by protonation, i.e., by the protons released upon activating the acid-generators immersed in the polymer melt. In other words, a chemical reaction relays and even amplifies an initial energy stimulus, to allow for the polymer chains to unzip.

The acid-generator may for instance be a thermal-acid-generator (TAG). The TAG molecules are thermally activated, e.g., by heating the probe as described in relation to FIG. 1. In this case, the probe 50 is heated, step 220, FIG. 2, in order to activate the TAG 40'. The result is substantially the same as what is obtained within the embodiment of FIG. 1. In a variant, the TAG molecules could also be activated by heating the entire sample. In another variant, an electrical stimulus could be used, relayed by the probe itself. Specific molecules known as squaric acid derivatives are particularly well suited to function as TAG.

Figure 3:
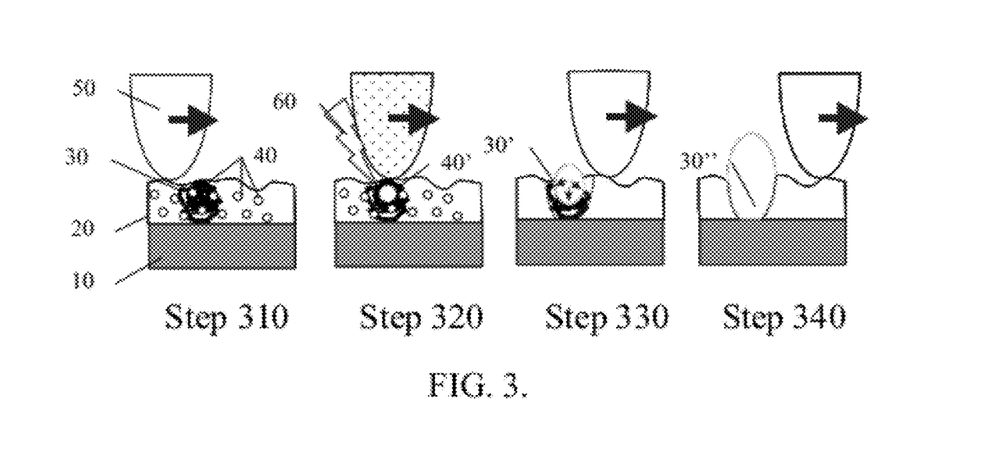

In the embodiment of FIG. 3, the acid-generator is a photo-acid-generator (PAG). In this case, the PAG is activated by light (e.g., by exposition to a light pulse 60), step 320, FIG. 3, in order to activate the PAG 40'. The light pulse may be provided by a source external to the probe 50. In a variant, the PAG molecules are activated by using the probe tip as a localized light source, as known from near-field-optical microscopy. The probe can be additionally heated in order to assist the activation of the PAG molecules and the depolymerization of the polymer chains.

Figure 4:
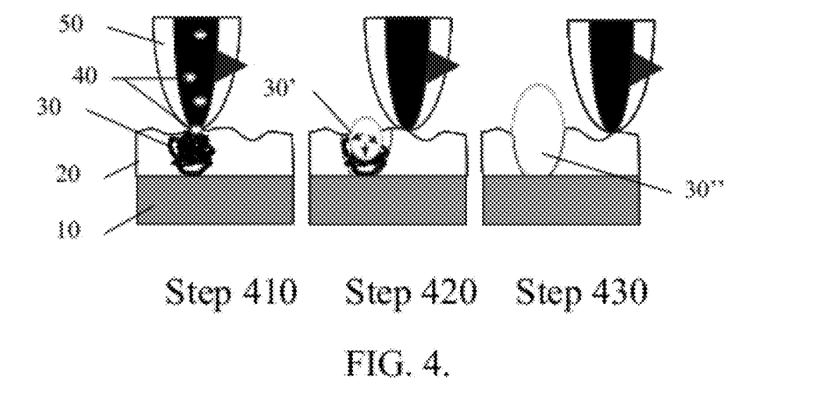

In further embodiments (FIGS. 4 and 5), the probe itself acts as a dispenser tool. Protons can for instance be provided in a native state in an acidic solution or in the form of TAG molecules dissolved in a suitable solvent, FIGS. 4 and 5.

The TAG molecules may be thermally activated i.e., by heating the dispenser probe as described above (step 410, FIG. 4). The TAG molecules could also be activated by heating the entire sample.

Figure 5:
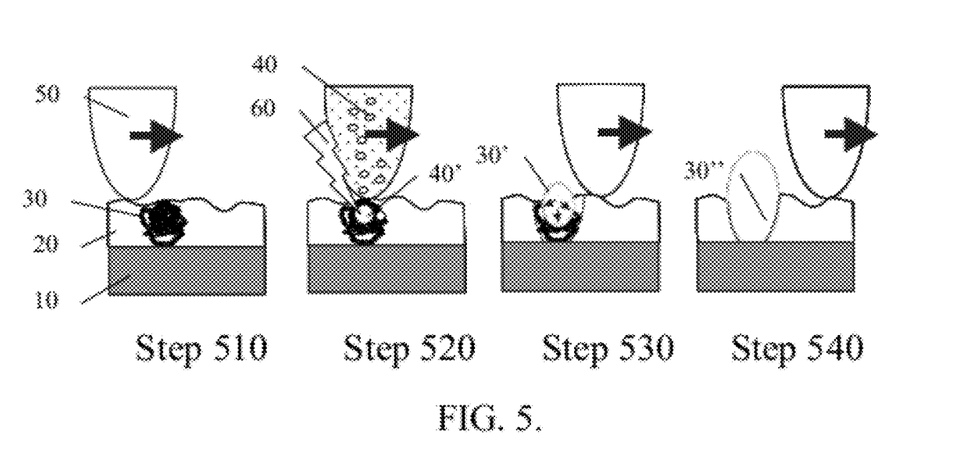

In the variant of FIG. 5, the probe is used to dispense PAG molecules which are activated by irradiating the sample with light 60 of suitable wave-length (typically in the ultraviolet range), as depicted in step 520.

In each of the above case, the film comprises polymer chains which are unstable (at least in part) under operating conditions. Be it obtained by direct heating with the probe or induced protonation, the polymer chains are believed to unzip, at least partly, upon breaking one chemical bond of the chain. Thus, the polymer used is advantageously chosen amongst a class of polymers which unzip upon breaking one chemical bond thereof.

The polymer whose chemical structure is depicted in FIG. 7 is one such polymer. As said, the polymer comprises approximately n=200 monomer units equivalent to a molecular weight of 27 kDa. Clearly, a suitable polymer film may essentially comprise polymer chains made of polymers such as depicted in FIG. 7. However, enhanced properties and operation ease can be obtained with a polymer film involving additional compounds, as to be discussed now. To that aim, copolymers are synthesized, i.e., they derive from two or more distinct monomers. One of the monomers is a dialdehyde compound or the like, e.g., phthalaldehyde, such as to enable unzip reaction in fine. In addition, at least another monomer is involved that is chosen such as to confer specific properties to the film. This gives rise to two distinct embodiments. In the first one, the polymer film comprises block-copolymer chains, while the second embodiment uses copolymers of phthalaldehyde and functionalizable compounds, such as benzaldehyde.

Block-Copolymer Embodiment

Here, at least some of the polymer chains (not necessary all of them) are block copolymers, i.e., involving two or more homopolymer block units (also called units). One of said blocks derives from dialdehyde monomers, which shall enable the unzip effect. For example, the polymer film is synthesized as a block-copolymer, wherein upward blocks (i.e., blocks in contact with the air interface) corresponds to the polymer of FIG. 7.

Thus, a core idea is to enhance patterning performance using polymer block copolymers comprising the unzip polymer as one of the blocks and exploit properties such as ordering properties conferred by one or more additional blocks (call them "functional" block polymers). In particular, at least some of the polymer chains of the film may be ordered and/or oriented by way of additional blocks that are more stable than the unzip block (e.g. thermally more stable). The polymer chains may for instance be oriented perpendicularly to the plane of the polymer film (i.e., the mean chain orientation has a perpendicular component). The block copolymer chains may even form a structured pattern on the surface of the film, such as a 2D lattice, whereby clean patterned film can be obtained.

Copolymers can for instance be deposited on a substrate 10, e.g., a Si wafer. The substrate can be overlaid by a neutral/compatibility layer 12, if necessary, e.g., to attract the ordering block polymer to the substrate interface, see FIG. 6A or 6B. Highly ordered films of one monolayer thickness can accordingly be formed, e.g., with unzip blocks 32 facing upward as stretched strands. The defined thickness of the layer 20 makes the patterning rather insensitive to the working parameters. Ideally, absence of entanglement improves the aspect ratio and the minimum feature size of the written structures. In addition, the nonvolatile block at the substrate prevents the tip from touching the substrate directly, which incidentally can be detrimental to the tip.

In a first implementation (FIG. 6A), the chains 30 extend if at all possible from the functional block 31 to the unzip block 32 (all chains at the surface ideally have a path to the functional block interface). The blocks are preferably symmetric in length (i.e., they have substantially the same length; they can be regarded as Gaussian coils). Indeed, If the length of one of the blocks is less than half the length of the other block, the polymer tends to form cylinders or spheres of the shorter block in a matrix of the other block. At the surface such a cylindrical phase would not lead to a uniform layer-like ordering as depicted). As said, a neutral layer 12 may facilitates vertical orientation of the functional blocks. Then, the patterning process may systematically penetrate to the functional block layer, as a result of removing the unzip polymer. Thus, removing an area of unzip polymer 32 may result in a very clean surface, provided that functional blocks 31 are suitably designed. As a consequence, the effective patterning depth obtained is made quite insensitive to forces. Also, a higher aspect ratio of patterns can be achieved, in comparison to usual films. Therefore, a patterning of a chemical contrast (or "surface contrast") can be achieved. A different chemistry is in fine exposed from the functional block layer: the chemical nature of the exposed surface can be tailored by an according design of the first polymer block 31.

Figure 6:
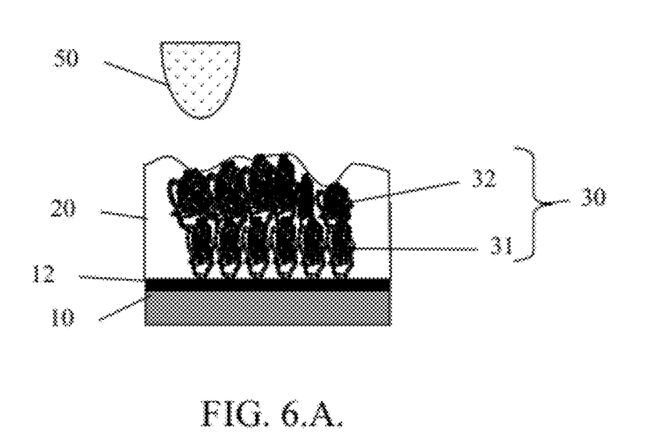
FIG. 6A exemplifies selective removal of unzip polymer in an ordered block copolymer film, in embodiments.
FIG. 6B illustrates in a perspective view the selective removal of microdomains of unzip polymer in an ordered block copolymer film, in embodiments.

In a second implementation (FIG. 6B), copolymers are once more deposited to form ordered films of one monolayer thickness. Here the fraction of the unzip block is typically only ⅓rd of the total block molecular weight (or length). This leads to an arrangement of hexagonally ordered unzip cylinders (microdomains) 32 embedded in a matrix of the functional polymer 31. Using a neutral layer 12, at which neither of the blocks preferentially segregates. The cylinders 32 may be oriented perpendicular to the plane of the film, as shown in FIG. 6B. Here again, the unzip block can be ordered by way of the functional polymer block (the matrix). The ordering occurs because of the composition of the block copolymer; in this case hexagonally ordered cylinders of the shorter block in a matrix of the longer block. The tip 50 can then be used to remove unzip blocks at desired prefix locations (such as location 25 on the film). Such an implementation combines advantages provided by the regularity of the block assembly 31, 32 together with locally defined removal of unzip material. Otherwise put: clean "holes" of constant contrast are obtained at desired locations in the pattern, whereby information can reliably be encoded and read.

The pattern formed by block copolymer chains 30 can be tailored according to various applications. This pattern can be ordered, repeated, etc., or not. In cases of repeating patterns (like in 2D crystals), the pattern as a whole may be regarded as a 2D lattice made up of repeating basis patterns at lattice points. An elementary basis pattern formed by block copolymer chains 30 on the top surface can itself be tailored, in some extent. Patterns available for block copolymers are spheres in a matrix, cylinders in a matrix or lamellae. FIG. 6B depicts cylinders; applications to nanowire gated transistors as described below would however use lamellae, which are oriented perpendicular to the substrate plane. Said pattern can even change along the lattice. For instance, the above principle is advantageously applied to multi-nanowire gated transistors, wherein wires can be removed with hot tip and the surviving pattern transferred into the substrate. Silicon bridges result between the drain and the source (not shown).

Chemical aspects are now discussed. As said, a preferred strategy is to design one block that is thermally stable while the second block is unstable and decomposes on heating into volatile moieties. This enables a solvent-free or dry patterning approach without the need to expose the substrate and resist to solvents, and the drawbacks associated with such processing. The following discloses a route to block copolymers where one block has a low ceiling temperature, i.e., one degradation event is amplified via an unzipping of the entire chain, while the second block is thermally stable. We focus, but not restrict, this embodiment to copolymers where one block is derived ~140° C. The second block can be chosen amongst a variety of blocks, e.g., having a functional group able to initiate a ring-closing polymerization of phthalaldehyde. The preferred functional group is, but not restricted to, an aliphatic alcohol. Polymerizations are accomplished below the ceiling temperature of the Poly(phthalaldehyde) (−45° C.) and generally at −7° C. The second block is preformed and can be prepared by condensation, ring-opening, controlled radical, anionic, cationic or other synthetic methods provided an initiating group or groups can be placed either at one or both chain-ends or along the polymer backbone. The preferred synthetic methods are controlled radical and anionic techniques owing to the wide range of monomeric substrates available and synthetic methods available. In addition to an initiating group, other functional groups are available that provide processability, solubility, wetting of the substrate, functional groups that can provide etch resistance, or post-dissolution.

Polymerizations are accomplished in solution (−78° C.) with an organic catalysts such as N-heterocyclic carbenes or phospazene bases. Upon completion of the polymerization, while cold, the reaction is quenched and the chains capped to prevent depolymerizaton while returning to room temperature. The polymer is isolated by precipitation and isolated by filtration.

Figure 8:
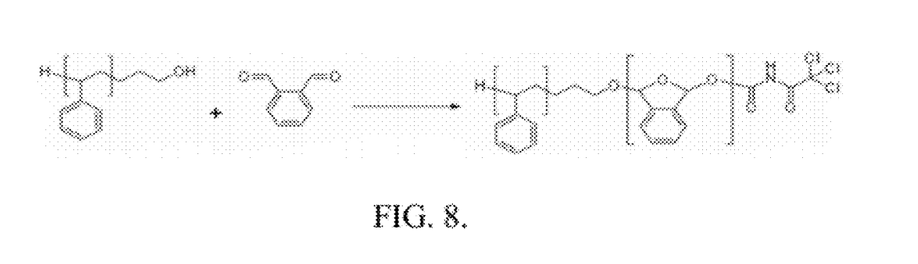
FIG. 8 is an example of polystyrene-phthalaldehyde block copolymer synthesis, as used in embodiments.

This can be exemplified through the synthesis of a poly-styrene-phtalaldehyde block copolymer, schematically represented in FIG. 8. This synthesis is reported below.

To a 20 mL culture tube were charged phthalaldehyde (274 mg, 2.04 mmol), hydroxyl functionalized polystyrene (110 mg, $M_n$=9000 g/mol, PDI=1.05), and dry THF (3.0 mL) in a glove box. The tube was then sealed with a rubber septum and cooled to −75° C. in a dry ice-acetone bath. A 0.05 M THF solution of P2-t-Bu (0.1 mL) was added to the mixture through a needle to initiate the polymerization. After continuously stirring at −75° C. for 1 hour, trichloroacetyl isocyanate (TCAI) (~0.1 mL) was added to quench the reaction and the mixture was kept stirring for at least 2 hours under the chilled condition. Then the viscous solution was allowed gently to warm up to room temperature and precipitated in methanol twice. The precipitates were centrifuged and dried under vacuum to give poly(styrene-b-phthalaldehyde) as white solid (293 mg, 76%). 1H NMR (CDCl$_3$): $\square$=7.75–6.19 (m, ~1208H; ArH$_{PPA}$, ArH$_{PS}$, CH$_{PPA}$), 3.33-3.16 (b, 2H; CH$_2$O), 2.29-1.16 (m, ~85H; CH$_2$, CH$_{PS}$), 1.67-1.17 (m, ~179H; CH2$_{PS}$). GPC (THF, RI): $M_n$=11000 g/mol, PDI=1.51. For completeness, GPC stands for "gel permeation chromatography"; $M_n$ is the number averaged molecular weight; PDI is for polydispersity index (how similar are the chains); the earlier numbers are positions of the resonances in the NMR spectrum.

Figure 9:
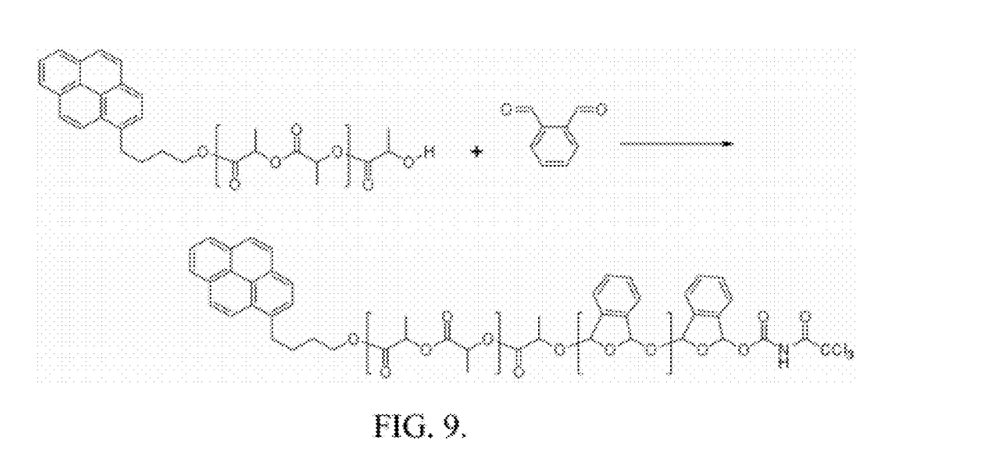
FIG. 9 is an example of poly-L-lactide-phthalaldehyde block copolymer synthesis, as used in embodiments

Another example is the synthesis of a poly-L-lactide (PLLA)-phtalaldehyde block copolymer, see FIG. 9.

To a 20 mL culture tube, phthalaldehyde (268 mg, 1.99 mmol), poly-L-lactide (145 mg, $M_n$=21600 g/mol, PDI=1.11), and dry THF (3.0 mL) were charged in a glove box. The tube was then sealed with a rubber septum and cooled to −75° C. in a dry ice-acetone bath. A 0.05 M THF solution of P2-t-Bu (0.1 mL) was added to the mixture through a needle to initiate the polymerization. After continuously stirring at −75° C. for 1 hour, TCAI (~0.1 mL) was added to quench the reaction and the mixture was kept stirring for at least 2 hours under the chilled condition. Then the viscous solution was allowed gently to warm up to room temperature and precipitated in methanol twice. The precipitates were centrifuged and dried under vacuum to give poly (L-lactide-b-phthalaldehyde) as white solid (206 mg, 50%). $^1$H NMR (CDCl$_3$): $\square$=8.27-7.82 (m, 9H; ArH$_{pyrene}$) 7.72-7.11 (m, ~286H; ArH$_{PPA}$), 7.11-6.26 (m, ~158H; CH$_{PPA}$), 5.25-5.05 (m, 160H; CH$_{PLA}$), 4.24-4.18 (m, 2H; CH$_2$O), 4.11-4.06 (m, 1H; CH$_{junction}$), 3.40-3.35 (m, 2H; pyrene-CH$_2$), 1.96-1.79 (m, 4H; CH$_2$), 1.68-1.39 (m, ~549H; CH$_3$ $_{PLA}$). GPC (THF, RI): $M_n$=10200 g/mol, PDI=1.64.

Copolymers of Phtalaldehyde and Benzaldehyde

While the previous embodiments have focused on block-copolymer chains, the polymer film can more generally exhibit chains of copolymers derived from two or more monomers, where the structural units of the copolymers are not necessarily arranged in block. One of the monomers remains yet a dialdehyde compound, e.g., a phthalaldehyde, such as to suitably enable unzip reaction. At least another monomer is involved that is chosen such as to confer specific properties to the film.

In an embodiment, the polymer film comprises copolymers of phthalaldehyde compounds and benzaldehyde compounds. The benzaldehyde is a commercially available compound and a variety of functional benzaldehydes are available that offer a facile means of introducing functional groups and enhancing polymer solubility/processability. This particular benzaldehyde compound lowers the ceiling temperature, which therefore can be tuned by the molar fraction. For instance, a phthalaldehyde polymer such as that of FIG. 7 has a ceiling temperature of ~150 C. Using a film made up of single polymer chains of phthalaldehyde typically requires tip heater temperatures >600° C., and heating times >10 μs for high-performance patterning (obviously, this depends on a number of experimental parameters). Now, high temperatures have several drawbacks: the lever behavior of the AFM device (or the like), calibration of force and temperature all are difficult to accurately control. More importantly the scaling to smaller pulse durations and higher patterning speeds is limited as even higher temperatures may result in destroying integrity of the lever. Therefore, it can be realized that a material with lower ceiling temperature (e.g., of ~100 to 120° C.) would be more convenient (as achieved with the benzaldehyde copolymer). In addition, a pure phthalaldehyde platform may not be versatile enough for some applications, it doesn't bear much functionality other than unzipping and has marginal solubility that restrict the quality and thickness of the resist films.

To overcome such limitations, present inventors have developed an approach to diversify the polymer backbone that provides the possibility to tailor the decomposition temperature, improve solubility and hence processability. In addition, providing functional groups along the backbone provide post-functionalization possibilities and versatility.

In the following, a family of monomers is discussed, namely, 4-(Benzyloxy)benzaldehyde, 4-(Dimethylamino) benzaldehyde, 4-(Hexyloxy)benzaldehyde, 4-[Bis-(2-chloroethyl)amino]benzaldehyde, 3-(1,1,2,2-Tetrafluoroethoxy) benzaldehyde, 4-(Diethoxymethyl)benzaldehyde, 4-(4-Morpholinyl)benzaldehyde, 4-(1-Piperidinyl)benzaldehyde, 4-(Trifluoromethyl)benzaldehyde, 4-(2-Pyridyl)benzaldehyde, 4-(4,4,5,5,6,6,7,7,8,8,9,9,10,10,11,11,11-Heptadecafluoroundecyloxy)benzaldehyde, 4-(4-Methylphenyl)benzaldehyde, 4-(Methylthio)benzaldehyde, 2,4-Bis(trifluoromethyl)benzaldehyde, 2-Fluoro-4-(trifluoromethyl)benzaldehyde, 3,5-Bis(trifluoromethyl)benzaldehyde, 4-(Boc-amino)benzaldehyde, 4-[(2-Cyanoethyl)methylamino]benzaldehyde, 4-[(tent-Butyldimethylsilyl)oxy]benzaldehyde, etc.

Such monomers can be co-polymerized with the core polymer via an organocatalytic approach to generate polymers of predictable molecular weights and narrow polydispersities, according to embodiments. To that aim, the chemistry of organocatalysis as applied to polymer chemistry is extended to the copolymerization of phthalaldehyde with benzaldehydes. The core phthalaldehyde monomer is difficult to functionalize and there are no commercial variant to this structure, to the knowledge of present Inventors. In contrast, benzaldehyde and functionalized benzaldehydes are pervasive and commercially available.

Figure 10:
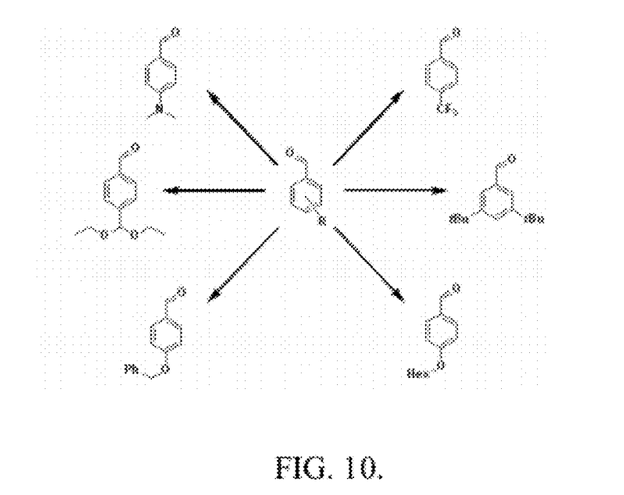
FIG. 10 represents accessible functionalities for benzaldehyde compound.

Next, the desired copolymerization can be demonstrated. These polymers show different decomposition temperatures, depending on the nature of the substituent(s), i.e., electron donating/withdrawing, solubility and offer the possibility of post modification. The versatility of this approach and a small sample of monomers that can be employed are for instance shown in FIG. 10.

Figure 11:
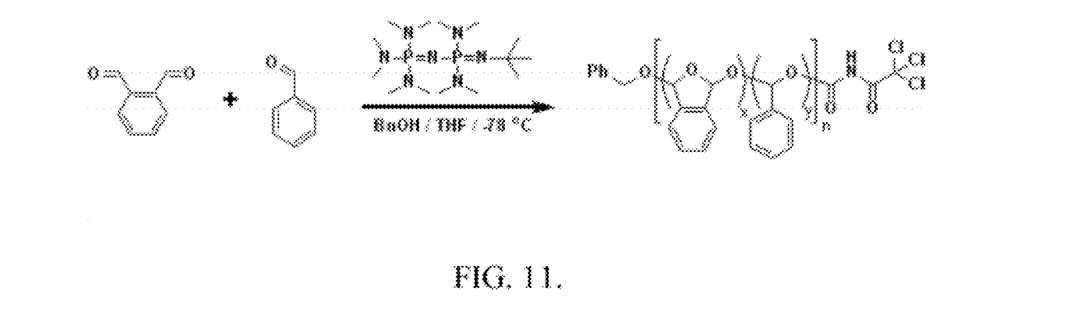
FIG. 11 is a possible reaction scheme for the co-polymerization of phthalaldehyde and benzaldehyde monomers, as used in embodiments.

An example of a suited copolymerization protocol follows, see also FIG. 11. In a nitrogen filled glovebox a test tube was charged with phthalaldehyde (0.200 g, 1.49 mmol), benzaldehyde (0.0200 g, 0.188 mmol), THF (1.50 g), benzyl alcohol (0.8 ③L, 0.00745 mmol) and a stir bar. In a separate vial, $P_2$-tBu Phosphazene base (0.00280 g, 0.00762 mmol) was dissolved in THF (0.500 g). Both solutions were removed from the glove box and cooled to −78° C. Upon temperature equilibration, the $P_2$-tBu Phosphazene base solution was syringed directly into the monomer mixture. The reaction temperature was constantly maintained at −78° C. for one hour at which point trichloroacetyl isocyante (100.0 mL, 0.839 mmol) was injected to quench the polymerization. The reaction mixture was then left in the cooling to bath to slowly warm to ambient temperature over a period of several hours. The polymer solution was then added to stirred iPrOH (20 mL) causing the polymer to precipitate. The white powder was collected via vacuum filtration yielding 0.193 g (88%). $M_n$=13.7 kDa, $M_w$=23.8 kDa, PDI=1.74. TGA/DSC: $T_d$=119° C., $T_m$=119° C. NMR: 7.15-7.80 (ar-H), 6.33-7.15 (ar-H).

Finally, the properties of copolymer materials (such as described above) as a lithographic medium was demonstrated. For example, a 50 nm thin film of copolymer was spun-cast on a silicon substrate and patterned using heated probes, as described in reference to FIG. 1. The probes were electrostatically actuated and heated with an integrated heater directly attached to the tip, as known per se. 'Pixels' were written by simultaneously applying a force and a heat pulse to the cantilever for 15 μs. A 500° C. tip-heater temperature was used, corresponding to elevating the polymer temperature to 230-270° C. As a result of the thermal activation, unzipping effects were observed. Note that the complete chain of the copolymer of FIG. 11 unzips. The disintegration of the unzip molecule into both monomer constituents. The monomer units at stake are highly volatile because of their low molecular weight (e.g., 134 Da and 106 Da). Thus, a fixed amount of material on the order of the volume occupied by one unzip polymer block removed whenever a bond is thermally broken. An efficient material removal was accordingly obtained as spontaneous depolymerization is faster than the mean initiation rate of bond-breaking governed by thermodynamic statistics.

A confirming image of the sample surface can then be obtained by reading patterns on the obtained surface. This is typically achieved by using the same probe as for patterning. As explained earlier, the probe-surface interaction is recorded as a function of position and images are produced as a two-dimensional grid of data points.

In conclusion, the experimental results, together with methods and principle discussed above demonstrate the possibility for patterning and subsequently reading polymer films with polymer chains of copolymers derived from two or more monomers (one of them being a dialdehyde compound), whereby polymer chains are able to unzip upon suited stimulation. Such methods can be exploited to pattern large areas of a polymeric film with high throughput and resolution, demonstrating a low-cost, table top, nanoscale patterning method.

While the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiment disclosed, but that the present invention will include all embodiments falling within the scope of the appended claims. For example, the present invention may be contemplated for various applications. While embodiments described above merely focus on uses for lithography (and data storage, implicitly), the skilled person may appreciate potential applications to pattern transfer of patterned regions into silicon.

What is claimed is:

1. An imaging medium comprising a single layer of a polymer film, the single layer of film comprising:
    polymer chains which can be unzipped upon stimulation; and
    nano-scale dimensioned patterns in the film, wherein the polymer chains comprise copolymers derived from two or more monomers, one of the monomers being a dialdehyde compound, and wherein the nano-scale dimensioned patterns are obtained according to a method comprising stimulating the film with a nano-scale dimensioned probe for selectively triggering an unzipping reaction of the polymer chains of the film to provide the nano-scale dimensioned patterns, wherein the polymer chains are configured to produce volatiles upon the stimulation to define the nano-scale dimensioned patterns.

2. The medium of claim 1, wherein said one of the monomers is a phthalaldehyde compound.

3. The medium of claim 1, wherein polymer chains comprise copolymers of phthalaldehyde compounds and benzaldehyde compounds.

4. The medium of claim 3, wherein at least some of the benzaldehyde compounds in the polymer chains of the polymer film provided are functionalized benzaldehyde compounds.

5. The medium of claim 1, wherein at least some of the polymer chains comprise block copolymers of two or more homopolymer units, one of the homopolymer units deriving from the dialdehyde compound.

6. The medium of claim 5, wherein said at least some of the polymer chains of the polymer film provided are ordered by way of another one of the homopolymer units substantially more stable than said one of the homopolymer units upon stimulation.

7. The medium of claim 6, wherein the polymer chains have an average orientation with a non-zero component perpendicular to a plane of the polymer film.

8. The medium of claim 7, wherein the polymer chains are further ordered such that said at least some of the polymer chains that comprise block copolymers form a structured pattern in the plane of the polymer film.

9. The medium of claim 7, wherein the polymer chains in the polymer film provided are further ordered such that said at least some of the polymer chains that comprise block copolymers form a two-dimensional lattice in the plane of the polymer film.

10. The medium of claim 5, wherein said one of the homopolymer units derives from a phthalaldehyde compound, whereas another one of the homopolymer units derives from a compound comprising a functional group capable of initiating a ring-closing polymerization of phthalaldehyde.

\* \* \* \* \*